(12) United States Patent
Kern et al.

(10) Patent No.: US 6,274,399 B1
(45) Date of Patent: Aug. 14, 2001

(54) METHOD OF STRAIN ENGINEERING AND IMPURITY CONTROL IN III-V NITRIDE SEMICONDUCTOR FILMS AND OPTOELECTRONIC DEVICES

(75) Inventors: R. Scott Kern; Changhua Chen, both of San Jose; Werner Goetz, Palo Alto; Chihping Kuo, Milpitas, all of CA (US)

(73) Assignee: LumiLeds Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/655,752

(22) Filed: Sep. 6, 2000

Related U.S. Application Data

(62) Division of application No. 09/092,478, filed on Jun. 5, 1998, now Pat. No. 6,194,742.

(51) Int. Cl.$^7$ ................................................. H01L 21/20
(52) U.S. Cl. ........................................... 438/22; 438/483
(58) Field of Search .................................. 438/483, 46, 47, 438/22, 24, 28, 34, 45

(56) References Cited

U.S. PATENT DOCUMENTS

| | | | |
|---|---|---|---|
| 5,436,466 | 7/1995 | Ko et al. | 257/13 |
| 5,458,085 | * 10/1995 | Kondo et al. | 438/46 |
| 5,488,233 | 1/1996 | Ishikawa et al. | 257/94 |
| 5,665,986 | 9/1997 | Miura et al. | 257/96 |
| 5,670,798 | 9/1997 | Schetzina | 257/96 |
| 5,729,029 | 3/1998 | Rudaz | 257/13 |
| 5,732,098 | 3/1998 | Nisitani et al. | 372/45 |
| 5,741,724 | * 4/1998 | Ramdani et al. | 438/46 |
| 5,751,021 | 5/1998 | Teraguchi | 257/103 |
| 5,793,061 | 8/1998 | Ohuchi et al. | 257/96 |
| 5,814,838 | 9/1998 | Ohtsuka et al. | 257/94 |
| 5,815,520 | 9/1998 | Furushima | 372/45 |
| 5,863,811 | * 1/1999 | Kawai | 438/483 |
| 5,874,320 | * 2/1999 | Shih et al. | 438/483 |
| 5,929,466 | 7/1999 | Ohba et al. | 257/103 |
| 5,963,787 | * 6/1999 | Kimura et al. | 438/46 |
| 6,081,001 | 6/2000 | Funato et al. | 257/94 |
| 6,146,916 | * 11/2000 | Nanishi et al. | 438/46 |

FOREIGN PATENT DOCUMENTS

| | | |
|---|---|---|
| 0 731 512 A2 | 9/1996 | (EP) . |
| 01103998 | * 4/1989 | (JP) . |
| 01212483 | * 8/1989 | (JP) . |
| 1033988 | * 5/1998 | (JP) . |

OTHER PUBLICATIONS

T. Hayakawa et al., "Improvements in AlGaAs laser diodes grown by molecular beam epitaxy using a compositionally graded buffer layer", Appl. Phys. Lett. vol. 49, No. 4, Jul. 28, 1986, pp. 191–193.

* cited by examiner

Primary Examiner—Savitri Mulpuri
(74) Attorney, Agent, or Firm—Skjerven Morrill MacPherson LLP; Mark E. Schmidt; Brian D. Ogonowsky

(57) ABSTRACT

In the present invention, an interfacial layer is added to a light-emitting diode or laser diode structure to perform the role of strain engineering and impurity gettering. A layer of GaN or $Al_xIn_yGa_{1-x-y}N$ ($0 \leq x \leq 1$, $0 \leq y \leq 1$) doped with Mg, Zn, Cd can be used for this layer. Alternatively, when using $Al_xIn_yGa_{1-x-y}N$ (x>0), the layer may be undoped. The interfacial layer is deposited directly on top of the buffer layer prior to the growth of the n-type (GaN:Si) layer and the remainder of the device structure. The thickness of the interface layer varies from 0.01–10.0 µm.

11 Claims, 6 Drawing Sheets

FIGURE 2 *(PRIOR ART)*

METHOD OF STRAIN ENGINEERING AND IMPURITY CONTROL IN III-V NITRIDE SEMICONDUCTOR FILMS AND OPTOELECTRONIC DEVICES

CROSS-REFERENCE TO RELATED APPLICATION

This application is a division of U.S. application Ser. No. 09/092,478, filed Jun. 5, 1998, which is incorporated herein by reference now U.S. Pat. No. 6,194,742.

FIELD OF THE INVENTION

The present invention relates to the manufacture of optoelectronic devices, in particular towards the strain engineering and impurity control in the grown layers.

BACKGROUND

Currently, there is no substrate material that can suitably match the lattice constants and thermal expansion coefficients of the compounds and alloys in the III–V nitride materials system. Thus, the ability to grow high-quality films of the III–V nitrides (AlInGaN) by standard epitaxial techniques (e.g., organometallic vapor phase epitaxy (OVPE), molecular beam epitaxy (MBE) and hydride vapor phase epitaxy (HVPE)) on mismatched substrates, like sapphire and silicon carbide, is a key component to producing high-quality layers and achieving optimal device performance. Growth of AlInGaN layers at typical growth temperatures (>1000° C.) results in films consisting of a mosaic assemblage of hexagonal nuclei. These layers exhibit a very rough morphology, very high background donor concentrations and are prone to cracking.

Using nucleation or buffer layers, deposited at low temperature (400–900° C.) on sapphire and at higher temperatures on silicon carbide, prior to high temperature growth, allows the crystal grower to dramatically improve the quality of epitaxial nitride films. Commonly, these buffer layers consist of AlN, GaN or some composition intermediate to these two binaries. The insertion of this low temperature buffer layer provides the means by which drastic differences in: 1) lattice parameter, 2) thermal expansion, 3) surface energy and 4) crystallography between the substrate, e.g. sapphire, and the nitride epilayer are overcome.

Nitride-based light-emitting diodes (LEDs) typically include a substrate, a nucleation or buffer layer, an n-type conducting layer, an active layer, a p-type conducting layer, and metal contacts to the n- and p-type layers. A schematic of a generic LED is shown in FIG. 1. Nitride LEDs typically have the structure shown in FIG. 2. The nucleation layer is commonly AlN, GaN or AlGaN.

An added complication when dealing with nitride epitaxy is the problem of cracking. Cracking arises when the epitaxial films are pulled in tension either due to: 1) lattice mismatch between substrate and film, 2) thermal expansion coefficient mismatch between substrate and film, 3) high doping levels and 4) lattice mismatch due to intentional compositional modulations during the growth of a nitride device. Typical nitride-based devices exhibit heavily doped layers, where the dopant concentrations often exceed $10^{18}$–$10^{19}$ cm$^{-3}$, and several compositional heterointerfaces. Data for the lattice parameter and thermal expansion coefficient for the nitrides and the common substrates (SiC and sapphire) are shown below in Table I

TABLE I

Properties of the nitrides and selected substrates

| | Material | | | | |
|---|---|---|---|---|---|
| | GaN | AlN | InN | sapphire | 6H-SiC |
| Lattice Constant (Å) | | | | | |
| a | 3.189 | 3.112 | 3.548 | 4.758 | 3.08 |
| c | 5.185 | 4.982 | 5.76 | 12.991 | 15.12 |
| Thermal Expansion Coefficient (/K$^{-1}$) | | | | | |
| a | $5.59 \times 10^{-6}$ | $4.2 \times 10^{-6}$ | $4 \times 10^{-6}$ | $7.5 \times 10^{-6}$ | $4.2 \times 10^{-6}$ |
| c | $3.17 \times 10^{-6}$ | $5.3 \times 10^{-6}$ | $3 \times 10^{-6}$ | $8.5 \times 10^{-6}$ | $4.68 \times 10^{-6}$ |

While the problems associated with lattice- and thermal-mismatch can be adequately addressed using existing nucleation layer technologies and by controlling the heating and cooling conditions associated with growth, cracking due to doping and intentional compositional fluctuations cannot be solved by such methods.

Cracking presents a considerable problem when GaN layers are doped n-type with Si (which has an ionic radius more than 30% smaller than Ga, the atom for which it substitutes) and when layers of differing compositions are deposited on one another. The second case is especially troublesome when the layer grown on top has a smaller a-axis lattice parameter than the layer on which it is grown, e.g. AlN or AlGaN deposited on GaN, due to the very rigid elastic constants exhibited by the III–V nitrides. Additionally, heterostructures consisting of nitride layers generally exhibit registry along the a-axis, which is parallel to the substrate film interface, and are distorted only along the c-axis, which is perpendicular to the substrate film interface. Thus, when a layer has a smaller relaxed a-axis parameter than the layer on which it is grown, tensile stress is induced in that layer in order to keep the interface in registry.

Another problem that the crystal grower typically encounters is that of unwanted impurities in otherwise pure crystals. Among the common impurities that can occur during the process of crystal growth, regardless of the method employed, oxygen is generally considered to be the most troublesome. Oxygen can severely limit the grower's ability to control conductivity, strain and optical luminescence. Sources of oxygen can include, but are not limited to, reactant sources, reactor walls and hardware, graphite susceptors or boats and even the substrate wafers themselves.

SUMMARY

In the present invention, an interfacial layer is added to a light-emitting diode or laser diode structure to perform the role of strain engineering and impurity gettering. A layer of $Al_xIn_yGa_{1-x-y}N$ ($0 \leq x \leq 1$, $0 \leq y \leq 1$) doped with Mg, Zn, Cd can be used for this layer. Alternatively, when using $Al_xIn_yGa_{1-x-y}N$ (x>0), the layer may be undoped. The interfacial layer is deposited directly on top of the buffer layer prior to the growth of the n-type (GaN:Si) layer and the remainder of the device structure. The thickness of the interfacial layer varies from 0.01–10.0 μm.

The interfacial layer increases device reliability and reproducibility because the problems associated with cracking, layer coalescence, and impurity trapping are relegated to a region of the device that is not active during device operation. To illustrate, the interfacial layer "getters" or traps the residual impurities (such as O) in the initial layer of the structure. In addition, this process also cleanses the chamber and the reactor components making them free of undesired impurities which would be present later when the more critical layers, e.g. the active layer or the p-type layers, in the structure are grown. The preferred embodiments for this layer include GaN:Mg and AlGaN for the composition of the interfacial layer because both Mg and Al have a high affinity for oxygen. Additionally, the use of this interfacial layer reduces the strain and lessens the driving force for cracking by changing the nature of the strain state of the nitride epilayer.

DETAILED DESCRIPTION OF THE DRAWINGS

Figure 1:
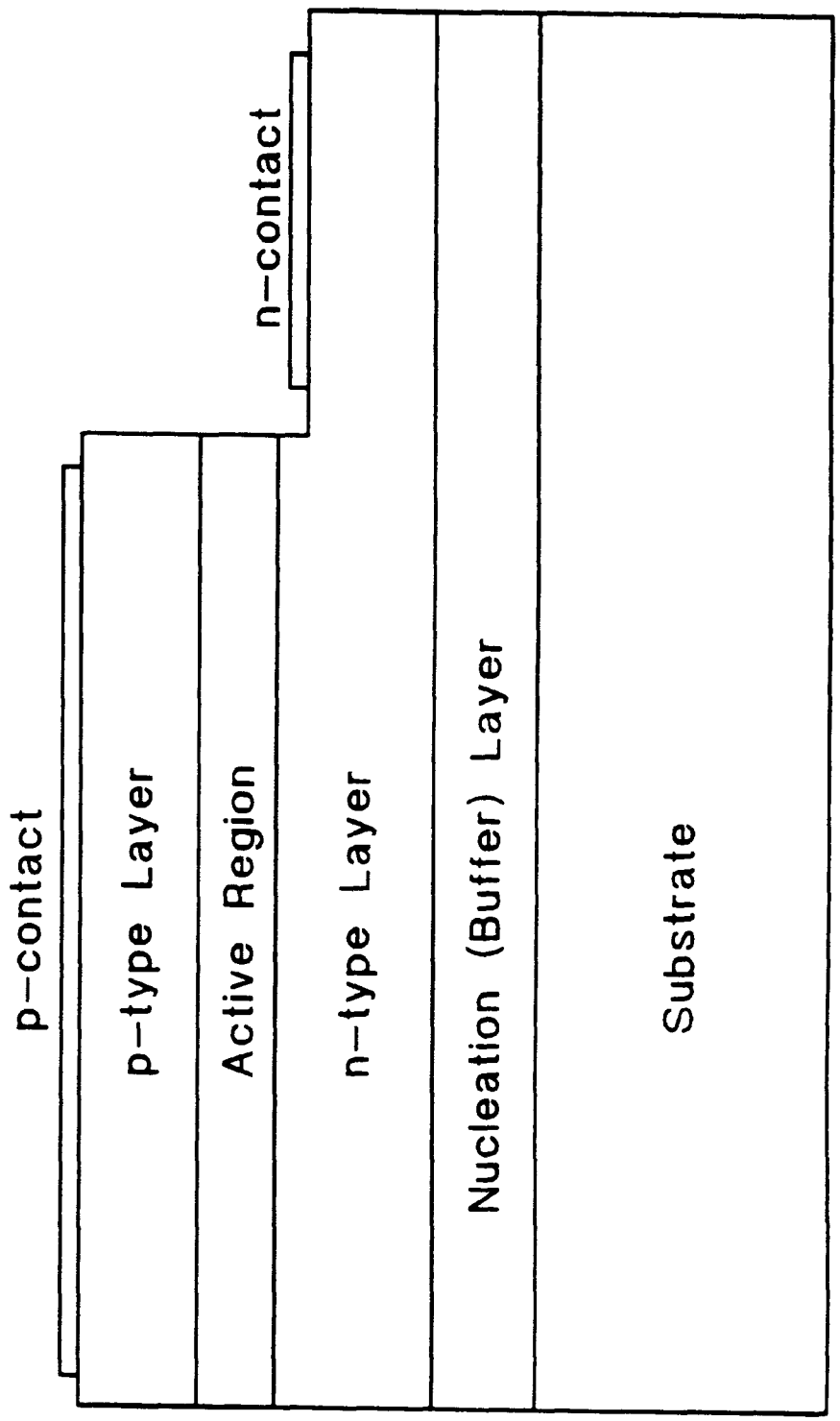
FIG. 1 illustrates a generic light-emitting diode of the prior art.
Figure 2:
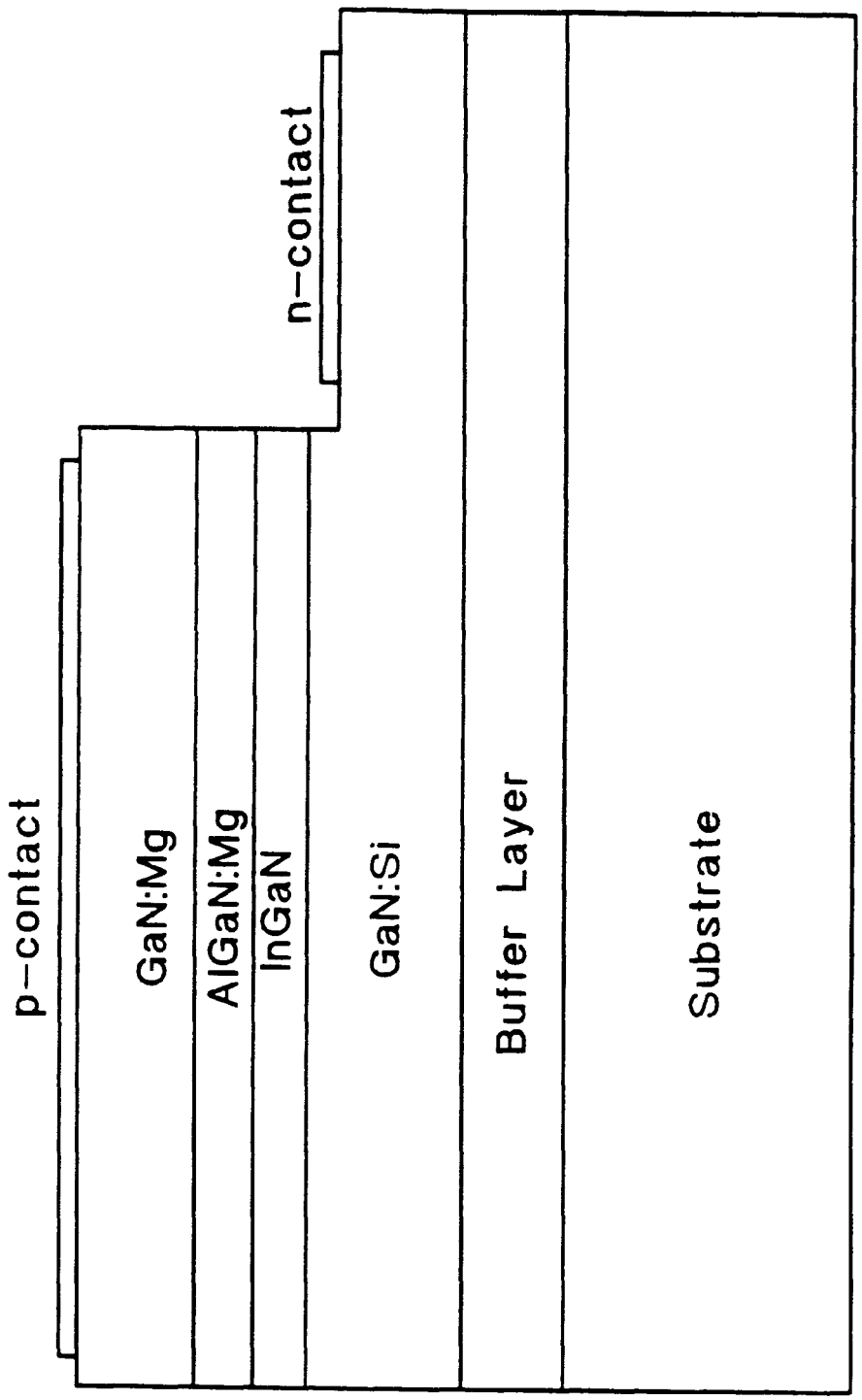
FIG. 2 illustrates a typical nitride-based LED of the prior art.
Figure 3:
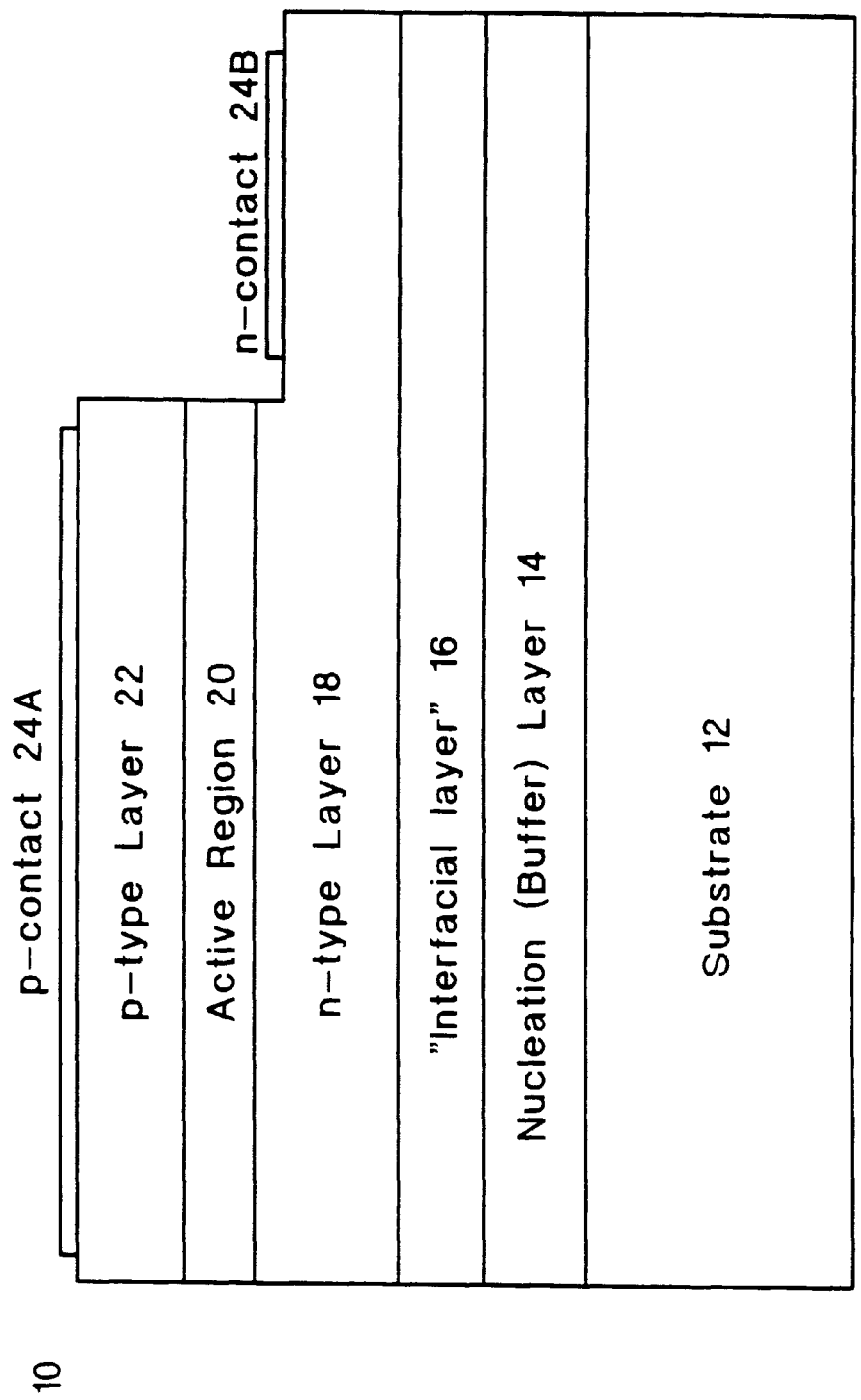
FIG. 3 illustrates a light-emitting diode of the present invention.

FIG. 3 illustrates an embodiment of the present invention 10. An interfacial layer 16 is added to a light-emitting diode or laser diode structure to performs the role of strain engineering and impurity gettering. A layer of $Al_xIn_yGa_{1-x-y}N$ ($0 \leq x \leq 1$, $0 \leq y \leq 1$) doped with Mg, Zn, Cd can be used for the interfacial layer. Alternatively, when using $Al_xIn_yGa_{1-x-y}N$ with x>0, the interfacial layer may be undoped. The interfacial layer can also include alloys of AlInGaN, AlInGaP, and AlInGaAs, and alloys of GaN, GaP, and GaAs. The interfacial layer 16 is deposited directly on top of the buffer layer 14 prior to the growth of the n-type (GaN:Si) layer 18, active region 10, and the p-type layer 22. The thickness of the interfacial layer varies from 0.01–10.0 μm, having a preferred thickness range of 0.25–1.0 μm. Buffer layer 14 is formed over a substrate 12. Substrate 12 maybe transparent. Metal contact layers 24A, 24B are deposited to the p-type and n-type layers 22, 18, respectively.

The interfacial layer increases device reliability and reproducibility by "gettering" or trapping the residual impurities, e.g., oxygen, in the initial layer of the structure. The process also cleanses the chamber and the reactor components making them free of further impurities which would be present later when the more critical layers, e.g., the active layer or the p-type layers, in the structure are grown. The preferred embodiment uses GaN:Mg and/or AlGaN for the composition of the interfacial layer because both Mg and Al have a high affinity for oxygen. Generally, the sources that are affected adversely by the presence of oxygen-containing impurities, e.g. those containing Mg, Zn, and Al, are easier to use and less prone to pre-reactions and, ultimately, gas-phase depletion after the interfacial layer is grown.

Figure 4:
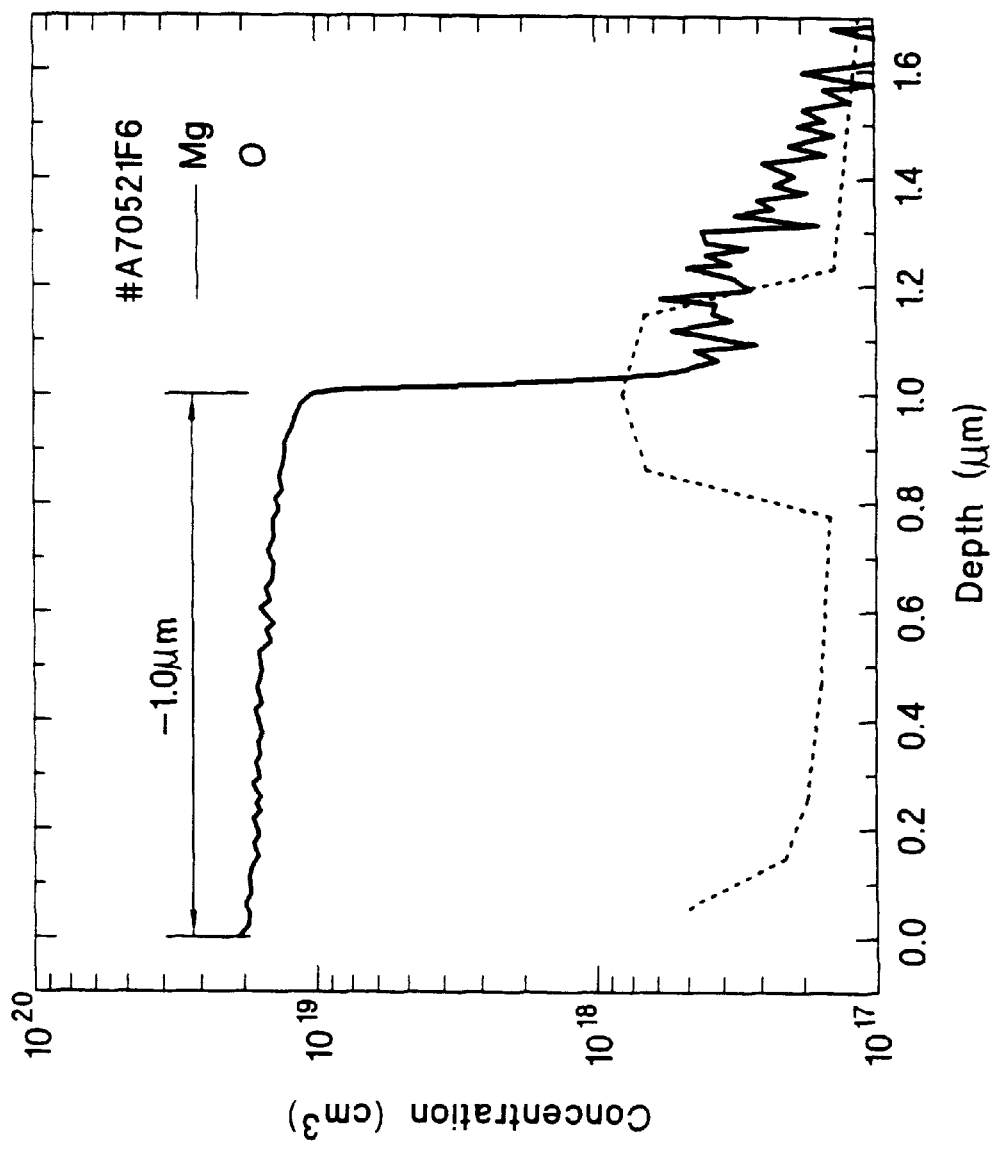
FIG. 4 shows a SIMS profile of a GaN:Mg layer where the presence of O at the interface can be clearly seen.
Figure 5:
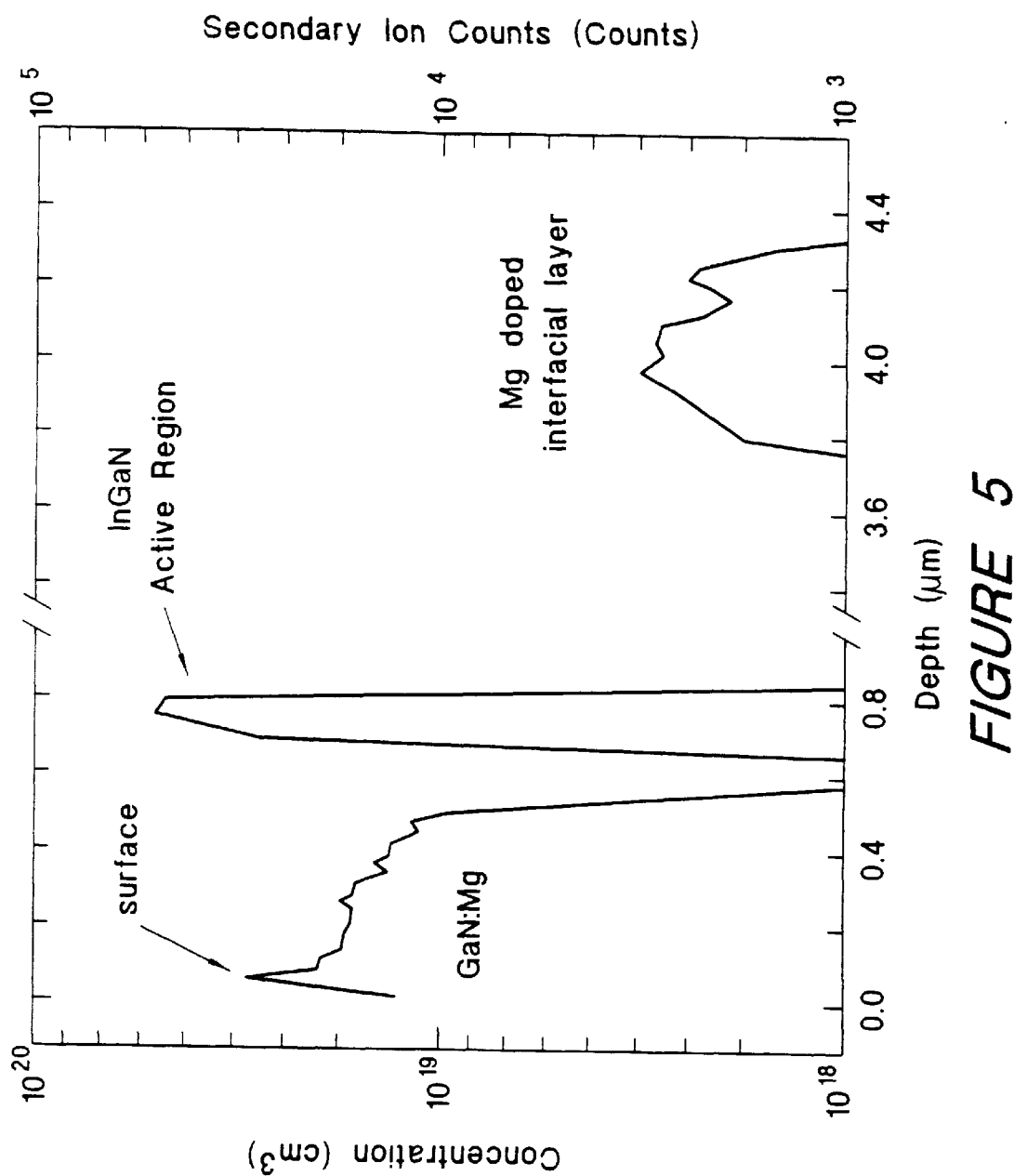
FIG. 5 illustrates the depth profile for Mg of a prior art LED.
Figure 6:
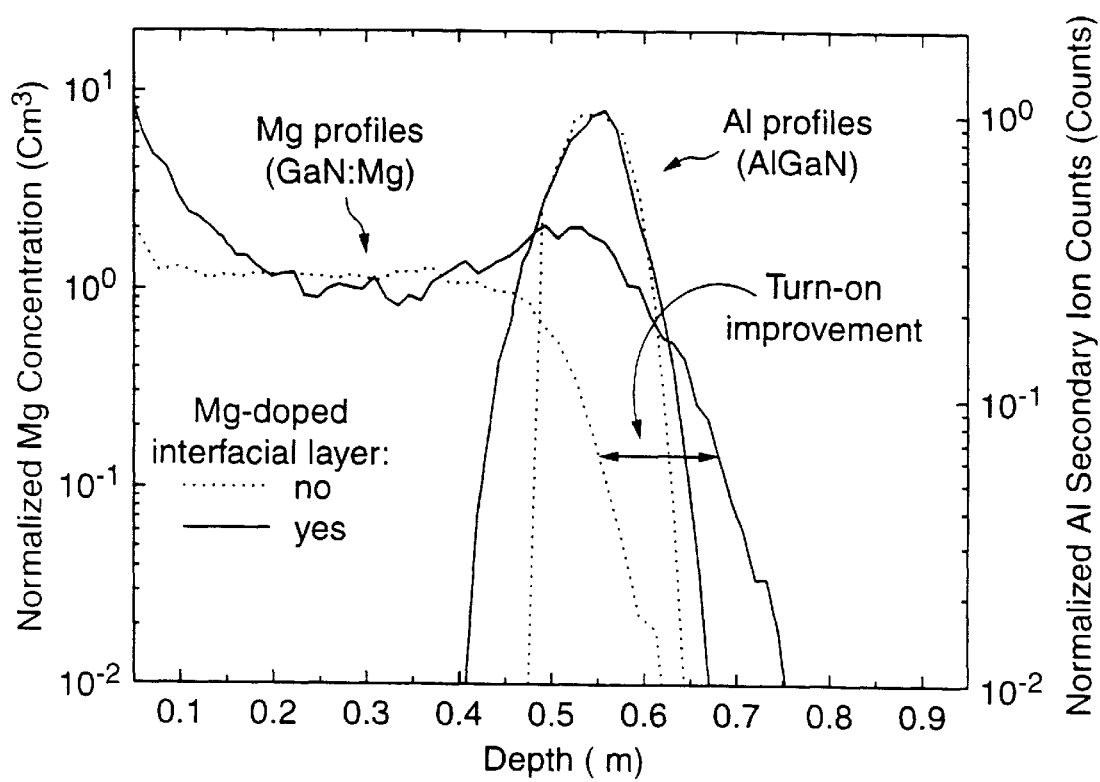
FIG. 6 illustrates the depth profile for Mg using the method of the present invention.

FIG. 4 shows a secondary ion mass spectrometry (SIMS) profile of a GaN:Mg layer where the presence of oxygen at the interface can be clearly seen. After the first 0.25–0.35 μm, the concentration of oxygen is reduced to the SIMS background level, indicating that the oxygen has been trapped in this non-critical portion of the structure. FIG. 5 shows the Mg profile in a GaN-based LED. The Mg-doped region on the right side of the figure is the interfacial layer described in this invention. The In profile is provided as a marker, indicating the location of the active region.

When the GaN:Si layer is directly deposited on the buffer layer (as is typical for GaN-based optoelectronic devices), cracking tends to be a problem. Si has a smaller atomic radius than that of Ga (0.41 vs. 0.62 Å), which Si displaces from the lattice. Films doped with Si are grown in a state of tension, an unfavorable state for brittle materials, e.g. GaN. The size of the Mg and Zn ionic radii are comparable to that of the atom for which they substitute when doping (Ga=0.62 Å; Mg=0.66 Å; Zn=0.74 Å). Additionally, the ionic radius of Cd is 0.94 Å. Incorporating these atoms into the GaN layer shifts the strain state associated with dopant impurities to that of compression, a very favorable state for GaN. Similarly, for GaN grown on AlGaN, where the AlGaN has a smaller lattice constant than GaN, the GaN layer will be in a state of compression and result in a significant reduction in cracking.

In the prior art, one major problem seen in all manufacturing processes using Mg as a dopant source is the issue of turn-on time. Due to its reactive nature and strong attraction to moisture and oxygen as well as the reactor plumbing and walls, Mg is often a difficult impurity to control during crystal growth. Often, the chemical profile for Mg takes an extended time and substantial film thickness before reaching an equilibrium concentration. Since the carrier mobility and lifetime for holes in GaN:Mg are generally low, the placement of Mg, and hence the location of the p-n junction is critical for efficient LED operation. Since the thickness of the interfacial layer is generally larger than the thickness required to achieve the equilibrium concentration of magnesium, the present invention can be used to greatly reduce the time needed to reach equilibrium concentration. The result is a much sharper Mg profile, producing a sharp junction between the n- and p-type layers in the structure and improving the device efficiency. A comparison between profiles using the prior art and the method described here are presented in FIG. 5. Both y-axes are normalized to reflect an absolute Mg concentration of $5 \times 10^{18} – 5 \times 10^{21}$ cm$^{-3}$.

We claim:

1. A method for manufacturing a light-emitting diode comprising the steps of:
   forming a buffer layer over a substrate;
   forming an interfacial layer over the buffer layer, the interfacial layer including a dopant that has an affinity for oxygen bearing compounds, the interfacial layer formed from a material selected from the group consisting of GaN, GaP, and GaAs;
   forming an n-type layer directly on the interfacial layer;
   forming an active region over the n-type layer;
   forming a p-type layer over the active region; and
   depositing at least two metal contacts, wherein one of the metal contacts is connected to the n-type layer and the other of the metal contacts is connected to the p-type layer.

2. The method of claim 1, wherein the dopant has an ionic radius on the order of a radius of an atom being substituted.

3. The method of claim 1, wherein the dopant is selected from the group consisting of Mg, Zn, and Cd.

4. A method for manufacturing a light-emitting diode comprising the steps of:
   forming a buffer layer over a substrate;
   forming an interfacial layer over the buffer layer, the interfacial layer including a dopant that has an affinity for oxygen bearing compounds, the interfacial layer formed from a material selected from the group consisting of alloys of AlInGaN, AlInGaP, and AlInGaAs;
   forming an n-type layer over the interfacial layer;
   forming an active region over the n-type layer;
   forming a p-type layer over the active region; and
   depositing at least two metal contacts, wherein one of the metal contacts is connected to the n-type layer and the other of the metal contacts is connected to the p-type layer.

5. The method of claim 4, wherein the dopant has an ionic radius on the order of a radius of an atom being substituted.

6. The method of claim 4, wherein the dopant is selected from the group consisting of Mg, Zn, and Cd.

7. The method of claim 4, wherein the substrate is transparent.

8. The method of claim 4, wherein the n-type layer is formed directly on the interfacial layer.

9. A method for manufacturing a light-emitting diode comprising the steps of:
   forming a buffer layer over a transparent substrate;
   forming an interfacial layer over the buffer layer, the interfacial layer including a dopant that has an affinity for oxygen bearing compounds, the interfacial layer formed from a material selected from the group consisting of alloys of GaN, GaP, and GaAs;
   forming an n-type layer directly on the interfacial layer;
   forming an active region over the n-type layer;
   forming a p-type layer over the active region; and
   depositing at least two metal contacts, wherein one of the metal contacts is connected to the n-type layer and the other of the metal contacts is connected to the p-type layer.

10. The method of claim 9, wherein the dopant has an ionic radius on the order of a radius of an atom being substituted.

11. The method of claim 9, wherein the dopant is selected from the group consisting of Mg, Zn, and Cd.

* * * * *